United States Patent [19]

Visel et al.

[11] Patent Number: 5,349,495
[45] Date of Patent: Sep. 20, 1994

[54] SYSTEM FOR SECURING AND ELECTRICALLY CONNECTING A SEMICONDUCTOR CHIP TO A SUBSTRATE

[75] Inventors: Thomas A. Visel, Phoenix, Ariz.; Jon M. Long, Livermore, Calif.

[73] Assignee: VLSI Technology, Inc., San Jose, Calif.

[21] Appl. No.: 592,709

[22] Filed: Oct. 4, 1990

Related U.S. Application Data

[63] Continuation-in-part of Ser. No. 370,932, Jun. 23, 1989, abandoned.

[51] Int. Cl.$^5$ .............................................. H01R 9/00
[52] U.S. Cl. ..................... 361/774; 174/267; 228/180.22; 257/773; 257/784; 257/779; 361/679; 361/760; 361/776
[58] Field of Search ............ 174/263, 267, 52.4; 228/180.2; 361/400, 392, 403–406, 408, 417, 421, 420; 734/773–776, 778–779, 784

[56] References Cited

U.S. PATENT DOCUMENTS

| | | | |
|---|---|---|---|
| 3,991,347 | 11/1976 | Hollyday | 361/406 |
| 4,787,853 | 11/1988 | Igarashi | 361/406 |
| 4,814,944 | 3/1989 | Sagawa et al. | 361/403 |
| 4,836,435 | 6/1989 | Napp et al. | 228/180.2 |
| 4,955,523 | 9/1990 | Calomagno et al. | 228/180.2 |
| 5,062,567 | 11/1991 | Nishihara et al. | 228/180.2 |

Primary Examiner—Gregory D. Thompson
Attorney, Agent, or Firm—Majestic, Parsons, Siebert & Hsue

[57] ABSTRACT

A system for securing and electrically connecting a semiconductor chip to a body of passive substrate. The semiconductor chip and the substrate are both provided with bonding pads or bonding areas. The bonding pads or areas are located so that when a chip is placed next to the substrate, at least some of the bonding pads on the chip are aligned with corresponding bonding areas on the substrate. Micro-pins in the shape of straight wires, stubs or loops are used to electrically connect some of the bonding pads on the chip to corresponding areas on the substrate thereby electrically connecting them and also securely bonding the chip to the substrate. In the preferred embodiment, epoxy is used to further strengthen the physical bonding between the chip and the substrate. The wicking action of the micro-pins reduces bridging of solder across adjacent micro-pins.

19 Claims, 9 Drawing Sheets

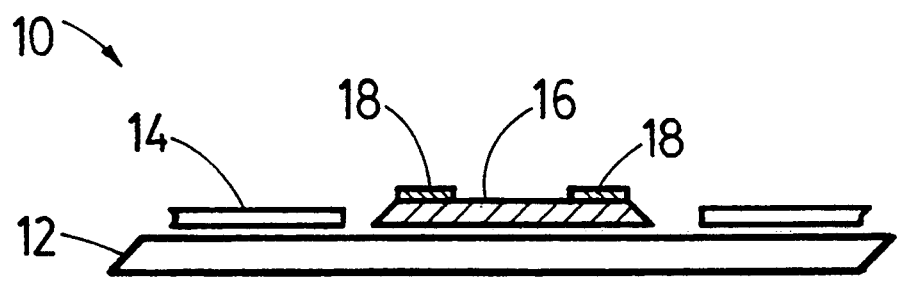
FIG.__1A.
PRIOR ART
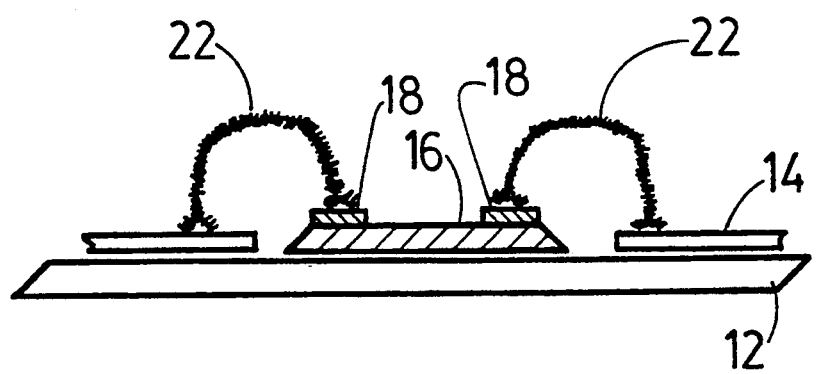
FIG.__1B.
PRIOR ART
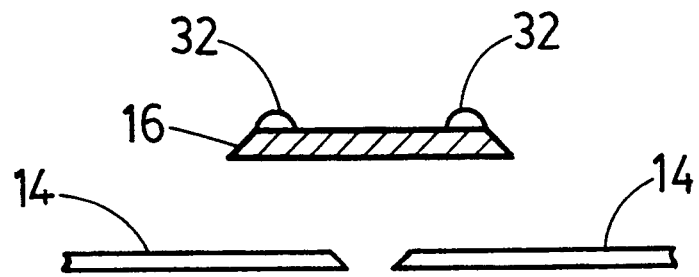
FIG.__2A.
PRIOR ART

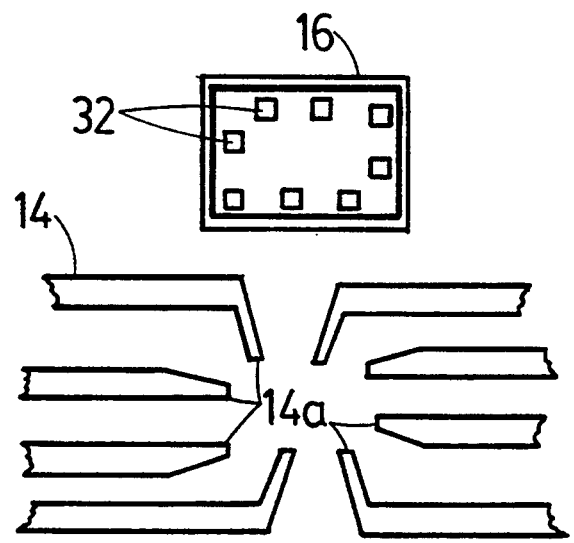
FIG._2B.
PRIOR ART
FIG._2C.
PRIOR ART
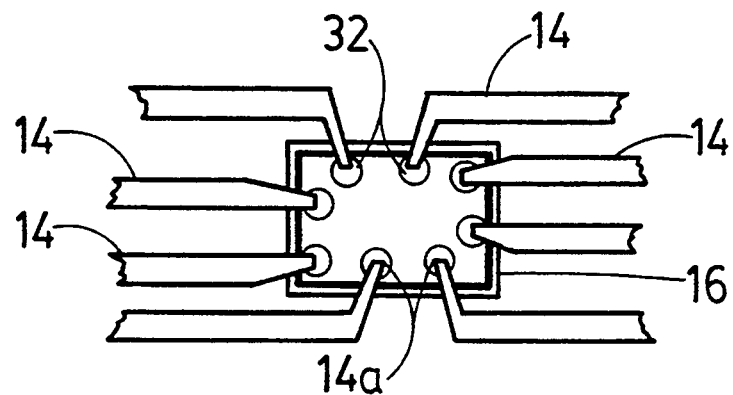
FIG._2D.
PRIOR ART

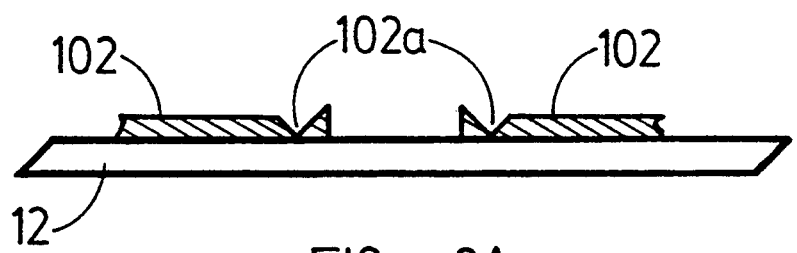
FIG._3A.
FIG._3B.
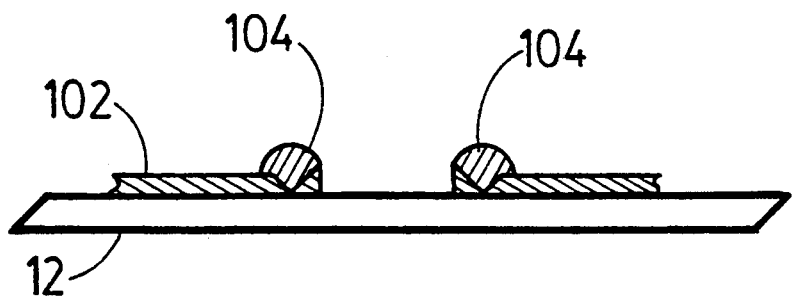
FIG._3C.
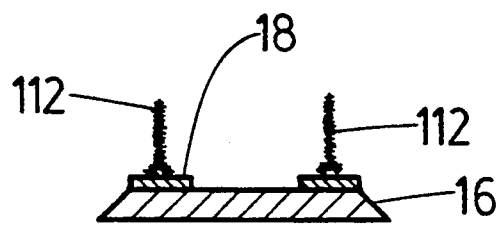
FIG._3D.

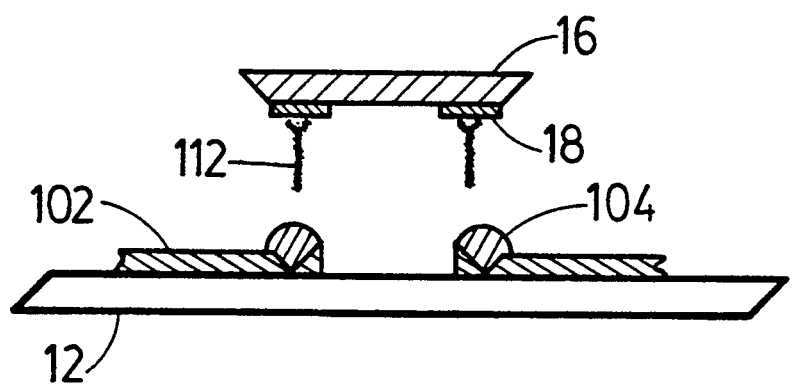
FIG._3E.
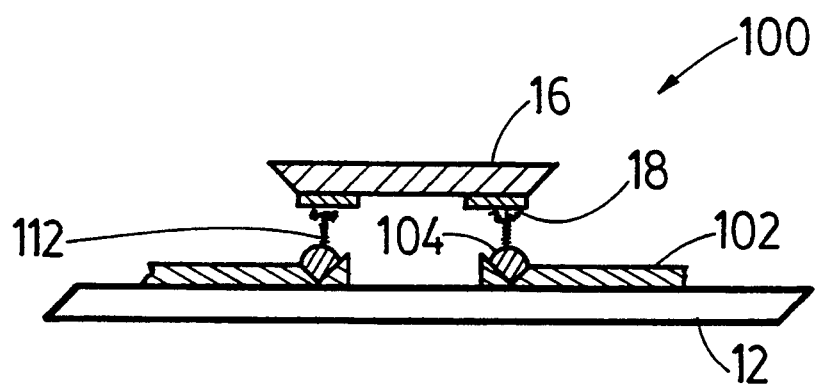
FIG._3F.
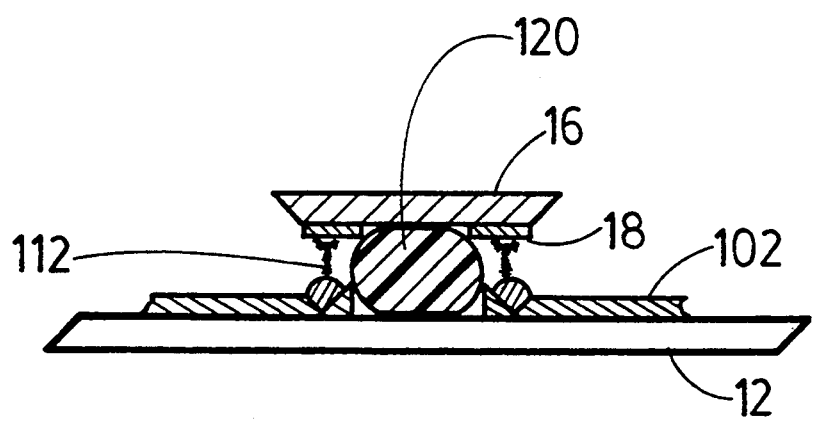
FIG._3G.

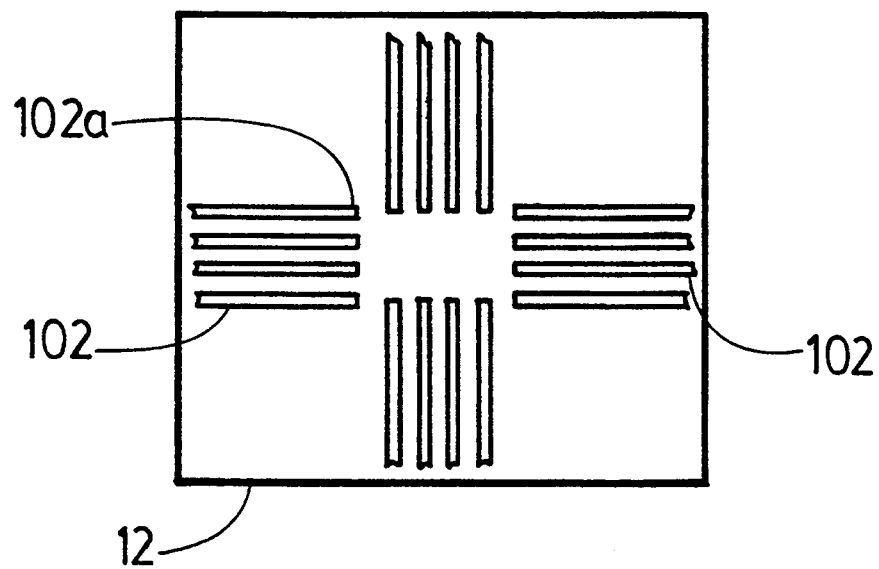
FIG._4A.
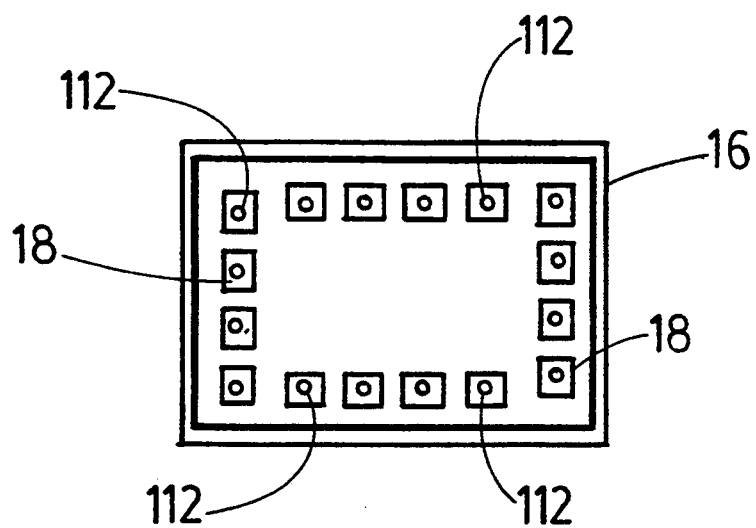
FIG._4B.

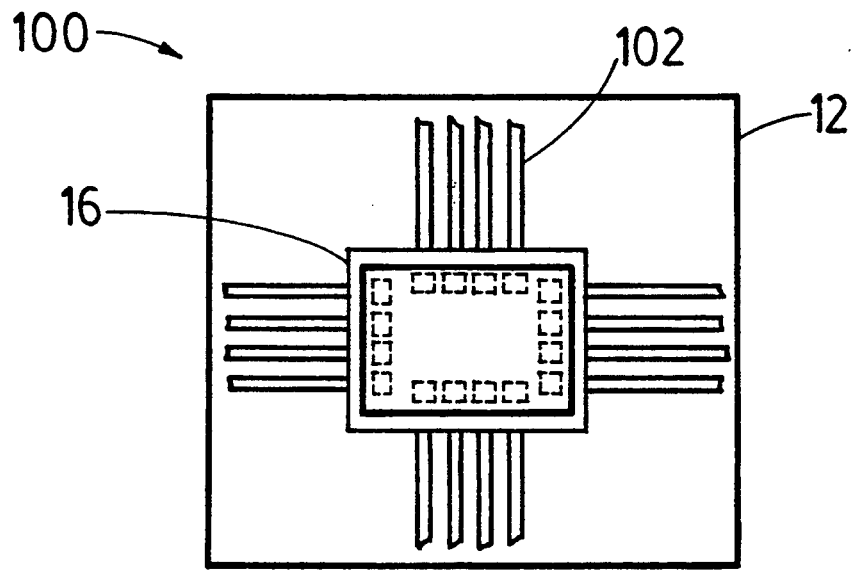
FIG._4C.
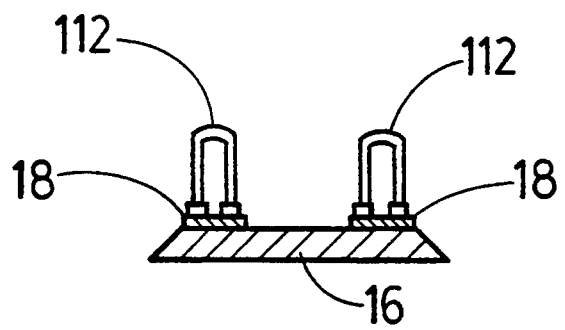
FIG._5.

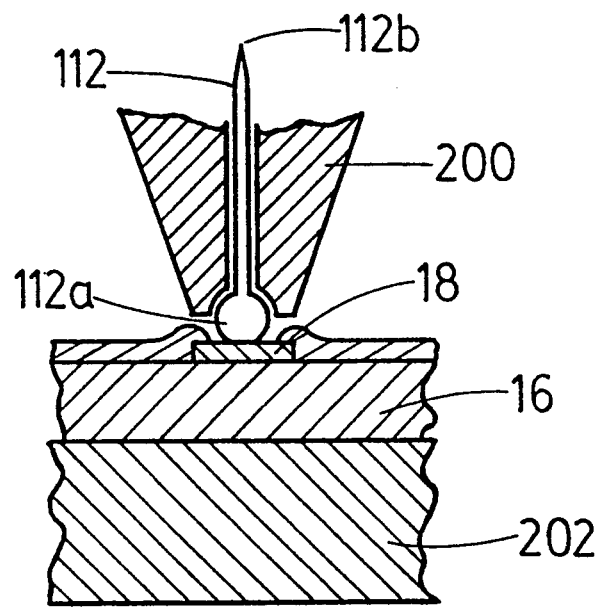
FIG._6A.
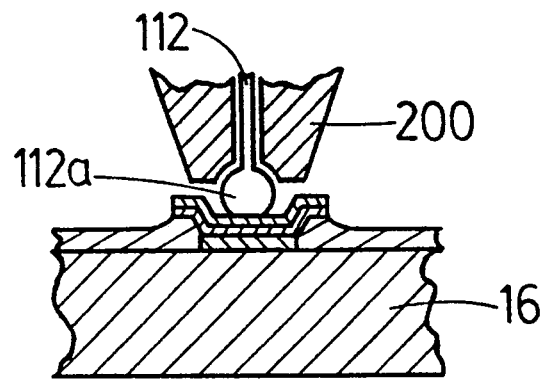
FIG._6B.
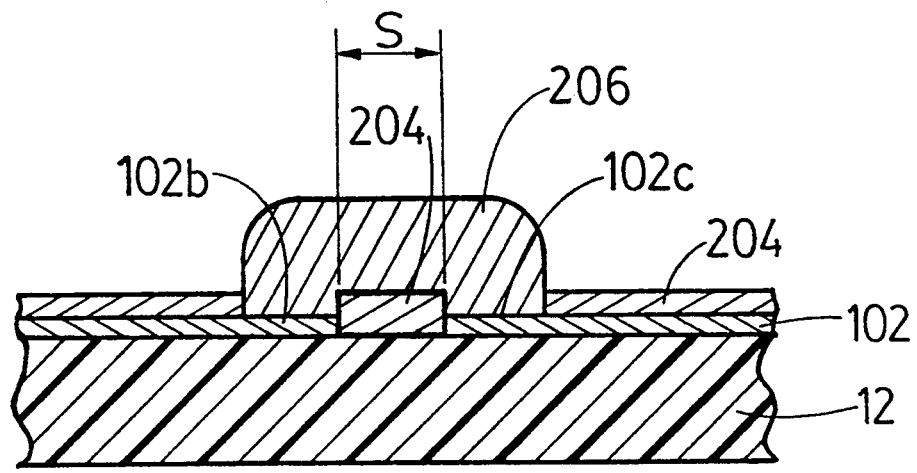
FIG._7A.

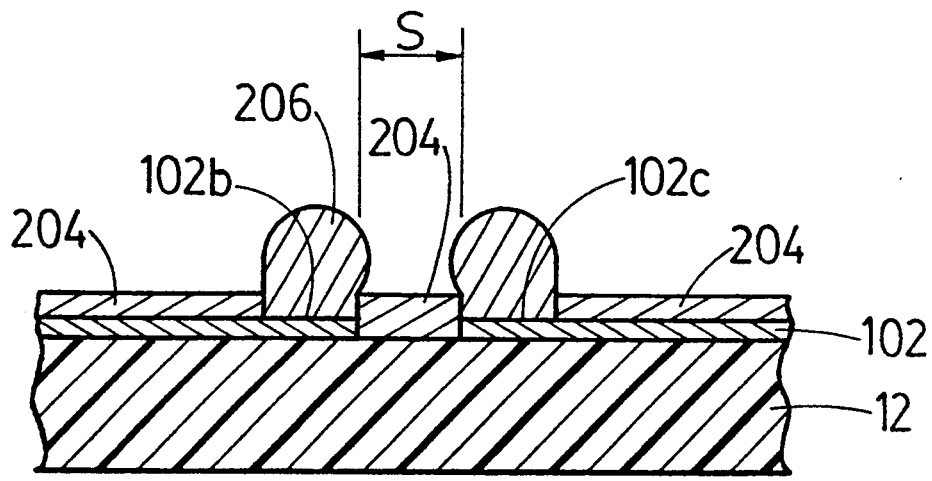
FIG._7B.
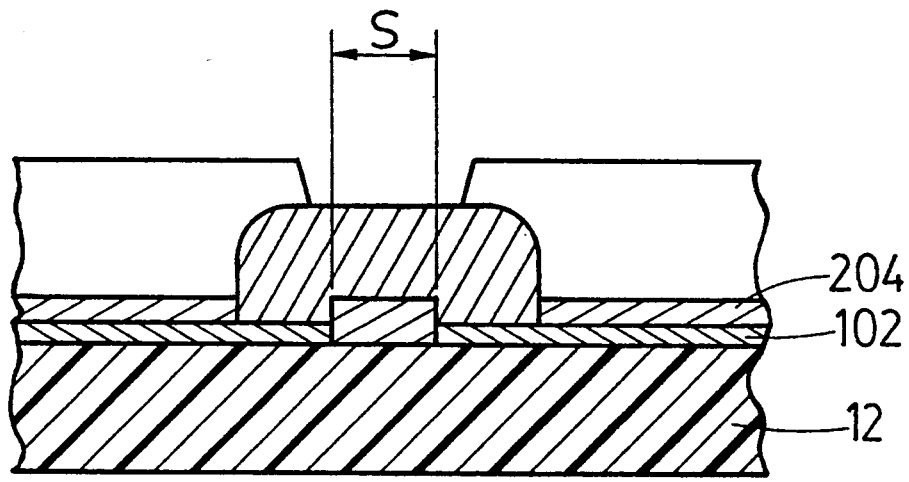
FIG._7C.
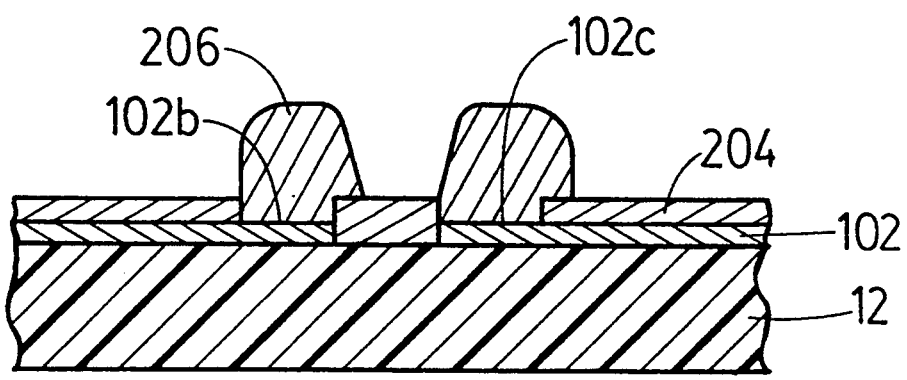
FIG._7D.

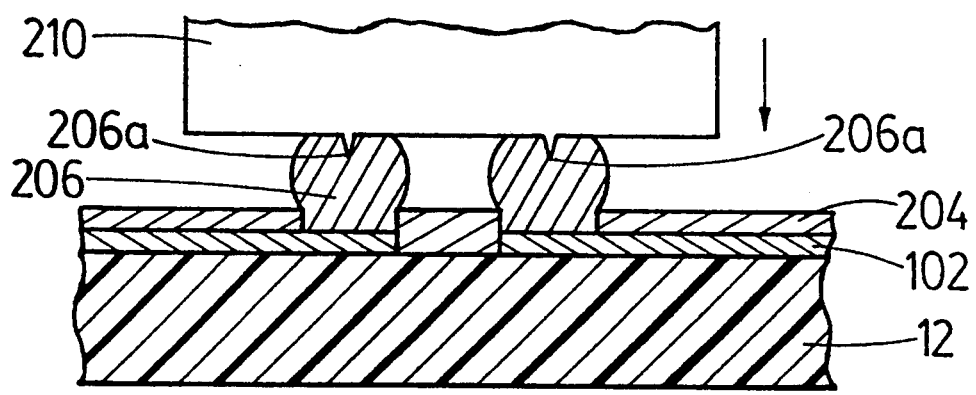
FIG._8A.
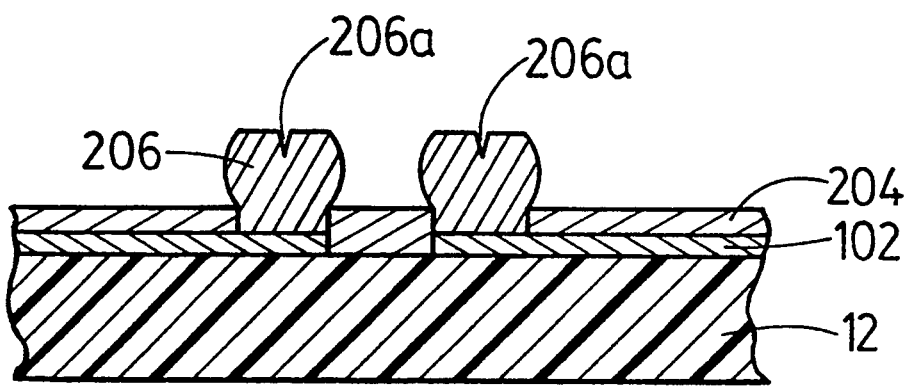
FIG._8B.
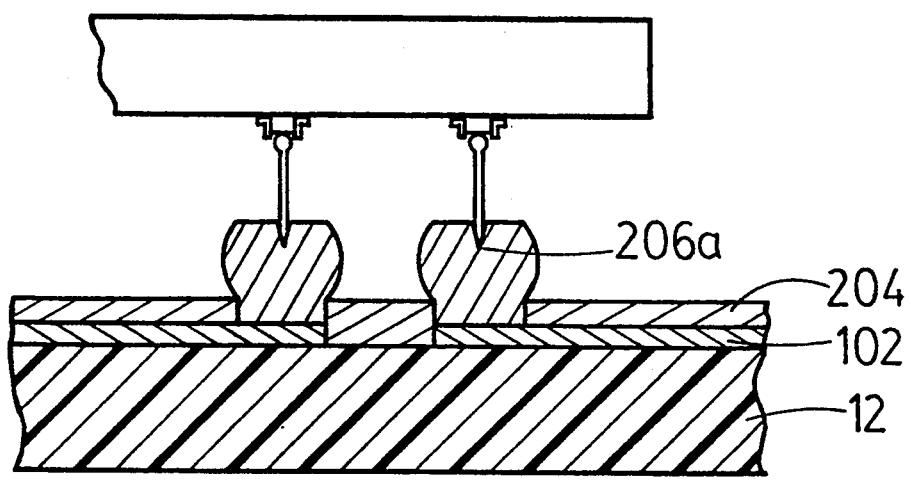
FIG._9.

SYSTEM FOR SECURING AND ELECTRICALLY CONNECTING A SEMICONDUCTOR CHIP TO A SUBSTRATE

This application is a continuation-in-part application of U.S. patent application Ser. No. 370,932, filed Jun. 23, 1989 entitled A SYSTEM FOR SECURING AND ELECTRICALLY CONNECTING A SEMICONDUCTOR CHIP TO A SUBSTRATE, now abandoned.

BACKGROUND OF THE INVENTION

This invention relates in general to semiconductor chip bonding techniques and apparatuses and in particular, to a system for securing and electrically connecting a semiconductor chip to a substrate. In conventional packaging technology, a semiconductor chip is usually first enclosed within a semiconductor package, and the package in turn connected to a large substrate such as a printed circuit board. To provide electrical connections between the semiconductor chip and the printed circuit board, the chip is first electrically connected to a carrier, substrate or a package and the carrier, substrate or the package then in turn connected electrically to conductive traces on the board. For example, in many conventional chip packages, bonding wires have been used to connect selected points on a semiconductor chip to bonding fingers on the surface of a substrate used to support the chip.

The above-described system for mounting a semiconductor chip on a printed circuit board is disadvantageous for a number of reasons. In many applications where space on the printed circuit board is at a premium, such as in notebook or laptop computers or those used in many military and space applications, the above-described system is wasteful of space on the printed circuit board. Furthermore, by first enclosing the semiconductor chip within an intermediate substrate to form a semiconductor package, the package designer would have to find a way to dissipate the heat generated by the chip enclosed by the substrate. Where the substrate is made of a poor heat conductor such as plastic, the heat generated can be a significant problem.

Semiconductor chip packages typically are provided with pins at the outside surfaces of the package where the pins are electrically connected through vias or fingers and bonding wires to the semiconductor chip inside the package. The pins are then connected to conductive traces on the printed circuit board by a conventional method such as soldering. The pitch between adjacent pins or leads of a semiconductor package is typically in the range of 25–100 mils where the pins or leads themselves typically have diameters or lead widths in the range of 6–20 mils.

With the advent of miniaturized devices such as laptop or notebook computers or in military and space applications, it is desirable to provide denser electrical connections between the chip and the printed circuit board. The above-described conventional package system limits how dense these connections can be. It is therefore desirable to provide chip bonding techniques that permit denser spacing of electrical connections then permitted by conventional techniques.

One way to provide denser electrical connections between the chip and the printed circuit board is to directly bond the semiconductor chip to the board without using an intermediate substrate such as a semiconductor package. One such conventional packaging system that has been used is known as "flip-chips," where solder bumps have been used to bond selected points on the semiconductor chip directly to bonding pads or conductive traces on the printed circuit board or to a lead frame. In order to connect the chip to the printed circuit board, the solder bumps are heated until they reflow so as to electrically connect and physically attach the semiconductor chips to the board. When the solder bumps reflow, they are in a semifluid state. To avoid any bridging which causes shorts, the solder bumps cannot be placed too close together so that a minimum spacing between bond pads of 5–8 mils must be maintained between adjacent electrical connections in the "flip-chip" system. Furthermore, the material that the printed circuit board is composed of may have a different thermal expansion coefficient compared to the material of the semiconductor chip. Typically, the substrate material in the board would expand more than silicon. In the "flip-chip" system, the silicon material in the chip is spaced from the substrate by a distance of the order of 1 or 2 mils. Therefore, when a chip and a substrate bonded through the "flip-chip" system experience temperature variations, the solder joint between the chip and the substrate will be subjected to stresses and may break. Even if the solder joint between the chip and the substrate does not break right away when subjected to temperature variations, the cumulative effect of the variations and the resulting stresses over an extended period of time may cause such solder joint to break, thereby causing future reliability problems. This is true particularly where the solder joint is cooled from room temperature to below freezing temperatures.

None of the above-described packaging systems is entirely satisfactory. It is therefore desirable to provide an improved system for securing and electrically connecting a semiconductor chip to a substrate.

SUMMARY OF THE INVENTION

This invention is based on the observation that, by aligning bond pads on the semiconductor chip or die with the bonding areas on the substrate and using elongated members to electrically connect the bond pads to the bonding areas on the substrate as well as to physically and securely bond the die to the substrate, the above-described disadvantages of the "flip-chip" system are avoided altogether. By using elongated members, the alloy that is used for bonding the member to the bonding area of the substrate will be localized by wicking action. In this manner solder bridging across adjacent bonding areas is much reduced. Therefore, the bond pad pitch can be reduced to 2 to 3 mils instead of 5 to 8 mils for "flip-chip" type systems. Furthermore, since the semiconductor die is separated from the substrate by the elongated member, the mismatched thermal expansion and contraction between the die and the substrate are less likely to cause breakage of the joints between the die and the substrate so that the resulting structure is much more reliable.

As compared to the conventional system where the chip or die is bonded to a circuit board or large substrate through a carrier, substrate or package, the system of the invention is advantageous since it avoids the use of an intermediate carrier, substrate or package altogether and is therefore less costly and less time-consuming to install. By also avoiding the use of a package, the electrical connection between the die and the substrate is much shorter, greatly reducing the inductances of the connections, thereby resulting in a faster device. By avoiding the use of a package, the area of the printed circuit board or substrate taken up by the die is not much larger than the die itself, thereby minimizing the board space required. In contrast, semiconductor packages require much larger board surface areas.

The apparatus of this invention is for securing and electrically connecting a semiconductor chip to a body of substrate. The apparatus comprises a first set of bonding pads on the first surface of the chip and a second set of bonding areas on the second surface of the body. The pads in the first set and areas in the second sets are located such that when the two surfaces are placed adjacent each other, for at least some of the areas on the second set, each of the at least some areas in the second set is aligned with the pad in the first set. The aligned pad and area define a corresponding pair. The apparatus further comprises means for securing and electrically connecting at least some of the corresponding pairs, thereby securely bonding the chip to the body. The securing and electrically connecting means includes an alloy and a plurality of elongated members for drawing the alloy towards predetermined locations on the bonding areas to reduce the probability of bridging of the alloy.

BRIEF DESCRIPTION OF THE DRAWINGS

FIG. 1A is a cross-sectional view of a portion of a conventional semiconductor chip package before bonding wires are in place.

FIG. 1B is a cross-sectional view of the portion of the package of FIG. 1A but with bonding wires in place.

FIG. 2A is a cross-sectional view of portions of a lead frame and a silicon dice to illustrate the conventional "flip chip" design before the dice is connected to the lead frame.

FIG. 2B is a top view of the dice and lead frame portion of FIG. 2A.

FIG. 2C is a cross-sectional view of the dice and lead frame portion of FIG. 2A but after the dice has been connected to the lead frame.

FIG. 2D is a top view of the connected dice and lead frame of FIG. 2C.

FIG. 3A is a cross-sectional view of a substrate with traces and bonding areas to illustrate the invention.

FIG. 3B is a cross-sectional view of a silicon dice with bonding pads to illustrate the invention.

FIG. 3C is a cross-sectional view of the substrate of FIG. 3A with a low temperature solder alloy to illustrate the invention.

FIG. 3D is a cross-sectional view of the dice of FIG. 3B with bonding wires in the shape of "micro-pins" to illustrate the invention.

FIG. 3E illustrates the dice of FIG. 3D aligned with the solder in the bonding area of FIG. 3C to illustrate the invention.

FIG. 3F is a cross-sectional view of dice and substrate after the two are bonded together.

FIG. 3G is a cross-sectional view of the dice and substrate of FIG. 3F with an epoxy material to strengthen the physical bonding between the dice and the substrate.

FIG. 4A is a top view of the substrate of FIG. 3C with traces and bonding areas for supporting the dice of FIG. 3D.

FIG. 4B is an exploded top view of the dice in FIG. 3D for use with the substrate of FIG. 4A.

FIG. 4C is a top view of the dice and substrate of FIGS. 4A, 4B after the two are assembled together, and is therefore a bottom view of the device of FIG. 3F.

FIG. 5 is a cross-sectional view of a silicon dice and bonding wires in the form of loops to illustrate an alternative construction of the "micro-pin".

FIG. 6A is a cross-sectional view of a portion of a semiconductor die structure and a "micro-pin" and of equipment used for attaching the "micro-pin" to the bond pad of the die to illustrate a process for securing a semiconductor die to a printed circuit board.

FIG. 6B is a cross-sectional view of a portion of a semiconductor die and of a "micro-pin," barrier layers and the associated equipment for attaching the "micropin" to the bond pad of the die to illustrate a process for securing a semiconductor die to a printed circuit board.

FIGS. 7A–7D are cross-sectional views of a printed circuit board with copper leads, a solder layer and various other layers for applying solder to desired areas of the copper leads to illustrate a process for securing a semiconductor die to a printed circuit board.

FIGS. 8A–8B are cross-sectional views of a portion of a printed circuit board with copper leads and solder for illustrating a coining process for flattening the top of the solder and for creating alignment depressions therein to illustrate a process for securing a semiconductor die to a printed circuit board.

FIG. 9 is a cross-sectional view of portions of a printed circuit board with leads and solder with flattened tops and alignment depressions and of a semiconductor die with "micro-pins" attached thereto to illustrate the alignment of the pins with the alignment depressions in the solder to illustrate a process for securing a semiconductor die to the substrate.

DETAILED DESCRIPTION OF THE INVENTION

FIG. 1A is a cross-sectional view of a silicon dice, a lead frame and a substrate supporting the dice and the lead frame to illustrate a conventional package. As shown in FIG. 1A, conventional package 10 includes a package or substrate 12 supporting thereon lead frame ends 14. Substrate 12 also supports a silicon dice 16 located between the lead frame ends. Dice 16 has thereon bonding pads 18 for connecting selected points of the dice to the lead frame ends. It is usually desirable to connect a number of points on the dice to lead frames. Therefore dice 16 usually has a large number of bonding pads thereon where the pads are close to each other on the dice surface. The view in FIG. 1A shows the dice and substrate before the bonding pads are connected to the lead frame ends by bonding wires.

FIG. 1B is a cross-sectional view of the substrate, lead frame and dice of FIG. 1A but after bonding wires 22 are used to connect bonding pads 18 to lead frame ends 14 as shown in the figure. After the bonding wires are in place as shown in FIG. 1B, an injection molded potting material is often placed on top of and/or around substrate 12 so as to shield the dice, the lead frame and the bonding wires from the outside environment and also fix these components in place to prevent them from becoming loose. If adjacent pads 18 are located close to each other, the bonding wires connecting adjacent pads to lead frame ends will also be close to each other. If the bonding wires are so close together that some bonding wires may be caused to move sideways to contact adjacent bonding wires during the potting process, electrical shorts will be created causing malfunctioning of the packaged chip. The sideways movement of the bonding wire is known as wire sweep. For certain ceramic packages, wherein no potting material is used, the unsupported bonding wires 22 might be mechanically vibrated to cause similar shorts. Because of the wire sweep phenomenon and other such mechanical considerations in ceramic packages, a minimum spacing of about five to eight mils is maintained between adjacent pads so that the normal pad pitch is about five to eight mils for the conventional packages illustrated in FIGS. 1A, 1B.

The silicon dice lead frame and substrate shown in FIGS. 1A, 1B are a portion of the conventional package 10. A full package is shown for example in U.S. Pat. No. 4,724,472 to Sugimoto et al. As shown in FIG. 5A of Sugimoto, the package houses a semiconductor die where the die is connected to conductor pins at the outside of the package through bonding wires in the manner shown in FIGS. 1A, 1B of this application, vias through the package wall and conductor pads at the outside of the package. The conductor pins numbered 40 in Sugimoto have a diameter of 0.1 to 0.2 millimeters (column 4, line 22) and the conductor pads at the outside of the package are 0.2 to 0.5 millimeters square. In other words, the conductor pins in Sugimoto's package have diameters of 4 to 8 mils and the conductor pads are 8 to 10 mils square. As indicated above, the distance between adjacent conductor pads are typically in the range of 25 to 100 mils.

As is apparent from FIG. 5A of Sugimoto, in order to electrically connect and physically attach a semiconductor die (numbered 5 in Sugimoto) to a circuit board (numbered 2 in Sugimoto), the space actually taken up on the circuit board is much larger than that of the size of the die itself. Where the space on top of the circuit board commands a premium, such a system for securing and electrically connecting the die to the board is uneconomical and disadvantageous. Furthermore, since the die is completely enclosed within the package wall heat generated by the die may become a problem. The use of many packages would require thermally conductive paths and heat sinks in order to dissipate the heat generated by the die. One way to alleviate the above-described problems is to directly connect the die to the circuit board without an intermediate substrate such as a plastic or ceramic package. One conventional scheme directly connecting the die to the board is shown in FIGS. 2A, 2B of this application.

FIG. 2A is a cross-sectional view of a silicon dice 16 and portions of the lead frame 14 before the two are connected together in a conventional package known as a "flip chip". In this "flip-chip" arrangement, the dice and lead frame are not supported by a substrate. For simplicity, substantially identical components in this application are labelled by the same numerals in the figures of this application.

FIG. 2B is a top view of dice 16 and lead frame portion 14. As shown in FIGS. 2A, 2B, dice 16 is provided with solder bumps 32 for connection to the lead frame. As shown in FIG. 2B, the location of the solder bumps 32 are such that they are aligned with ends 14a of lead frame 14.

FIG. 2C is a cross-sectional view of the dice 16 and lead frame portion 14 of FIG. 2A after the two are connected to each other.

FIG. 2D is a top view of the device of FIG. 2C and of the dice and lead frame portion of FIG. 2B after the two are connected to each other. The solder bumps are melted in order to electrically connect lead frame ends 14a to selected locations on the silicon dice 16 as shown in FIG. 2D. The lead frame portion and the dice are then enclosed by a material such as plastic in a process such as molding.

In the "flip chip" design illustrated in FIGS. 2A-2D, it is evident that the lead frame fingers are long and are not supported by another substrate at locations close to dice 16 in subsequent processes. Therefore when the assembled "flip chip" is handled in subsequent packaging processes such as molding, lead frame fingers 14 may sway sideways to contact an adjacent finger if inadequate spacing is maintained between adjacent fingers in a phenomenon similar to wire sweep in the packages of FIGS. 1A, 1B. Similarly, when melted, solder bumps 32 might splash, overflow or other wise bridge adjacent fingers in a phenomenon known as "solder bridging." This "solder bridging" causes a similar electrical short. For this reason, minimum spacing of about five to eight mils must be maintained between adjacent solder bumps and between adjacent lead frame fingers.

With the advent of very large scale integration technology, it is desirable to connect a large number of points on the dice which are located very close together to points on a substrate or package. If the conventional packaging techniques of FIG. 1A, 1B, 2A-2D are used, the minimum spacing between connections and the minimum pad pitch of five to eight mils becomes a severe limitation on the possible density of electrical connections that can be achieved. This invention is based on the observation that by using a different bonding technique between the dice and the substrate or package, the pad pitch can be reduced and density between electrical connections can be greatly increased.

FIG. 3A is a cross-sectional view of a substrate 12 and traces 102 of a package 100 constructed using the bonding system of this invention. The complete package 100 is shown in FIG. 3F. As shown in FIG. 3A, the chemically formed traces 102 on substrate 12 are each provided with a depression 102a as a bonding area to a silicon dice.

FIG. 3B is a cross-sectional view of a silicon dice 16 with bonding pads 18. FIG. 3C is a cross-sectional view of the device of FIG. 3A and a low temperature solder alloy 104 filling the depressions 102a.

FIG. 3D is a cross-sectional view of the dice of FIG. 3B and of bonding wires 112 or "micro-pins" attached to the bonding pads 18. The bonding wires 102 are attached to the bonding pads 18 by a bonding technique described below.

FIG. 3E is a cross-sectional view of the devices of FIGS. 3C, 3D where the micro-pins 112 are aligned with the solder 104 as shown in the figure. Thus, FIGS. 3A-3G illustrate the unique bonding method taught by this invention. First traces with depressions 102a are prepared on the substrate as shown in FIG. 3A. These depressions are filled with solder 104 as shown in FIG. 3C. "Micro-pins" 112 are attached to bonding pads 18 as shown in FIG. 3D. Then the "micro-pins" are aligned with solder alloy 104 as shown in FIG. 3E. The substrate 12 is then heated causing the solder to flow. After the solder has melted, the "micro-pins" 112 are then lowered into the solder pile. The device is then cooled so that the "micro-pins" are then connected to the traces 102 as shown in FIG. 3F.

The "micro-pins" 112 then both electrically connect bonding pads 18 to traces 102 as well as physically attach dice 16 to the substrate 12. To strengthen the physical bonding between dice 16 and substrate 12, a thermally conductive epoxy 120 is applied between dice 16 and substrate 12 to securely attach the dice to the substrate. This reduces the adverse effects on the "micro-pins" 112 caused by forces applied to the completed device 100 in subsequent handling of the device.

FIG. 4A is a top view of substrate 12 with traces 102 for supporting the dice 16 of FIG. 3D, where the dice has bonding pads 18 located at locations that match the bonding areas 102a. FIG. 4B is an exploded view of dice 16 to be supported by the substrate of FIG. 4A.

FIG. 4C is a top view of device 100 of FIG. 3F after the dice has been bonded to the substrate as described above. As shown in FIG. 4B, the "micro-pins" 112 are substantially normal to the bottom surface of the dice.

In the conventional bonding system of FIGS. 1A, 1B, bonding pads on the dice are not aligned side-by-side with the bonding areas on the substrate. Furthermore, both ends of the bonding wires are bonded. For these reasons, relatively long bonding wires are required. In conventional packages, the bonding wires are of the order of 50 to 100 mils in length. In contrast, the bonding pads 18 of device 100 are aligned with the bonding areas 102a in the embodiment of FIG. 3A–3G. In addition, in as much as the "micro-pins" 112 are bonded only at one end instead of at both ends, they are relatively short, such as 10 mils or less. Hence, "micro-pins" 112 do not exhibit wire sweep compared to bonding wires in the conventional system of FIGS. 1A, 1B.

While the bonding pads 18 in the "flip chip" design are indeed aligned with lead frame ends 14a as shown in FIGS. 2A–2D, the lead frame fingers 14 are not supported by any rigid structure, so that they may sway sideways causing electrical shorts, in a phenomenon similar to wire sweep in the design of FIGS. 1A, 1B. In contrast, the "micro-pins" 112 in the design of FIGS. 3A–3G connect one rigid structure (dice 16, bonding pads 18) to another rigid structure (substrate 12, traces 102). Hence the "micro-pins" 112 will exhibit much reduced side swaying motion compared to fingers 14 of FIG. 2A–2D. For these reasons, the pad pitch (spacing between pads 18), the spacing between adjacent micro-pins 112 and the spacing between adjacent traces 102 may be much smaller than the five to eight mils required in conventional packages. The pad pitch and the minimum spacing between the "micro-pins" may be as little as two to three mils. This has the effect of almost doubling the pad density on the dice and also doubling the density of electrical connections 102 on the substrate 12.

The "micro-pins" 112 has another important function in that it acts as a wick means for drawing the solder alloy towards itself located on the bonding pads or traces to reduce the probability of "solder bridging" of the alloy across adjacent "micro-pins". Such wicking action of the "micro-pins" enables the pad pitch and the minimum spacing between electrical connections to be reduced to the order of two to three mils.

In FIGS. 3D–3G, the "micro-pins" are shown as straight wires. It will be understood that other configurations of "micro-pins" may be used and are within the scope of the invention. Thus FIG. 5 is a cross-sectional view of a silicon dice and bonding pads with loop-shaped "micro-pins" 112; it is to be understood that the figure is not drawn to scale and that the size of the loops and pads is actually much smaller relative to the size of the dice than that illustrated in FIG. 5. Alternatively, "micro-pins" in the shape of stubs may also be used. The "micro-pins" are preferably made of material which adheres to solder and which is non-oxidizing. Suitable materials that can be used for constructing the "micro-pins" include gold, aluminum, silver or copper. The substrate can be a circuit board which is of a chip-on-board or hybrid type construction. The circuit board may be constructed from ceramic, fiberglass, porcelain steel, aluminum or other suitable materials. The solder alloy 104 used is preferably a low temperature solder alloy.

Where the "micro-pins" are made of gold, the low temperature solder alloy may be a lead tin alloy of 90% lead and 10% tin. Where the "micro-pins" are made of copper or aluminum, the alloy may be a tin lead alloy with 60% tin and 40% lead. The process for securing and electrically connecting the semiconductor chip to a substrate will now be described in detail in reference to FIGS. 6A, 6B, 7A–7D, 8A, 8B and 9. FIG. 6A, 6B illustrate the process for connecting a "micro-pin" 112 to bonding pad 18 on the surface of a die 16. Where "micro-pin" 112 is made of gold, silver, aluminum or copper, the "micro-pin" is bonded directly to pad 18 as shown in FIG. 6A using bonding tool 200. A conventional process may be used. Thus die 16 is heated to an appropriate temperature such as around 200° C. using heater block 202. Ultrasound is applied to the base 112a of the "micro-pin" and pad 18 so that metal in the "micro-pin" 112 and the aluminum in pad 18 diffuse into each other to form a weld joint. The thermosonic process should not be performed at too high a temperature, such as above 350° C., which may cause weak and brittle intermetallic compounds to form such as gold-/aluminum compounds. Where the "micro-pin" 112 is made of aluminum, the die need not be heated at all so that the heater block 202 may be omitted.

The "micro-pin" 112 may also be made of a lead tin solder. In such event, it is necessary to cover the aluminum die pad 18 with tungsten to prevent the formation of a weak tin/aluminum intermetallic. The tungsten is further covered by a gold layer to prevent oxidation of the tungsten, all as shown in FIG. 6B. The lead-tin "micro-pin" may then be bonded to the gold layer on top of pad 18 by ultrasound. The tungsten and gold layers may be deposited onto pad 18 by sputtering or a vapor deposition process.

The next step in the process of securing and electrically connecting the semiconductor die to the substrate involves the application of an alloy to the appropriate portions of the surface of the substrate, all as illustrated in FIGS. 7A–7D. Substrate 12 typically has conductive traces thereon, such as copper leads 102. The copper leads would serve to connect the semiconductor die 16 to other devices also mounted on substrate 12. Thus it is desirable for the alloy to be deposited only on portions of lead 102 which are to be connected to the "micro-pins." For this purpose, the surface of substrate 12 and the surfaces of copper leads 102 are largely covered by a solder mask 204, exposing only the portions of leads 102, such as areas 102b, 102c, onto which solder is to be deposited, as shown in FIG. 7A, 7B. Then an alloy such as solder 206 is applied as shown in FIGS. 7A, 7B. The structure in FIG. 7A illustrates the situation where the distance S between two areas 102b, 102c is too small so that the solder adhering to these two areas bridges. FIG. 7B illustrates the structure formed when the distance S is large enough to prevent bridging between the solder adhering to the two areas.

Where the distance S is large enough to prevent bridging, the step of applying the alloy to the substrate is completed. Where bridging occurs as shown in FIG. 7A, further processing is necessary to remove the bridging as shown in FIG. 7C. As shown in FIG. 7C, a photoresist layer is deposited on the structure of FIG. 7A, exposing only the area of bridging. The bridging solder is then etched away to form a structure shown in FIG. 7D. FIG. 7D is a cross-sectional view of the resulting structure after the photoresist layer has been removed. The solder may be applied to the substrate to form the structures described above by a number of processes, including solder bath, vapor deposition and sputtering.

As discussed above, the bonding areas, such as areas 102b, 102c should be first aligned with the micro-pins and the bonding pads on the die connected to such pins before the alloy is reflowed to connect the die to substrate 12. As discussed above, base 112a of the "micro-pin" is attached to the bonding pad on the die. To accomplish the alignment, it is necessary to align the other unconnected end 112b of the "micro-pin" with a bonding area such as area 102b. In this alignment process, such unconnected end 112b is brought close to the alloy (solder) 206. The solder 206 usually takes on a round shape so that in such alignment process, the end 112b of the pin will tend to slide off the top surface of the solder, causing mis-alignment. For this reason, it is desirable to provide depressions on the top surface of the solder to facilitate the alignment process. To reduce the probability for the end 112b of the "micro-pin" to slide off the surface of the solder 206, it is also preferable to flatten the top surface of the solder. This may be performed by a coining process illustrated in FIGS. 8A, 8B. A coining tool 210 with a flat surface but with protrusions thereon at locations matching the pattern of the bonding areas such as areas 102b, 102c are pressed downwards as shown in FIG. 8A to flatten the top surface of solder 206 and to create depressions 206a therein. The resulting flattened top surface and depressions 206a are illustrated in FIG. 8B. The die with "micro-pins" 112 are then brought to a position adjacent substrate 12 as shown in FIG. 9 and the "micro-pin" 112 are then aligned with the depressions 206a, also shown in FIG. 9. The solder is then reflowed to connect the "micro-pins" to the bonding areas of substrate 12.

The depressions 102a of FIGS. 3A, 3C may be used also for the above-described alignment process illustrated in FIG. 9. For this purpose, the ends 112b of the "micro-pins" may be aligned with the depressions 102a after solder 104 in FIG. 3C has melted.

While the preferred embodiment described above has been described in terms of particular constructions, methods and materials, the details of such construction materials and method may be varied without departing from the scope of the invention which is to be limited only by the appended claims.

What is claimed is:

1. A semiconductor chip package comprising:
    a semiconductor die;
    a substrate structure;
    a first set of bonding pads on a first surface of the die;
    a second set of bonding areas on a second surface of the substrate structure wherein the pads in the first set and areas in the second set are located such that when the first and second surfaces are placed adjacent each other, and for at least some of the areas on the second set, each of said at least some areas in the second set is aligned with a pad in the first set, said two aligned pad and area defining a corresponding pair; and
    means for securing and electrically connecting at least some of the corresponding pairs, thereby securely bonding said semiconductor die to said structure,
    wherein said securing and electrically connecting means includes an alloy and a plurality of elongated members for drawing the alloy towards predetermined locations on the bonding pads to reduce the probability of bridging of the alloy.

2. The package of claim 1, wherein said plurality of elongated members comprises pins, stubs or loops.

3. The package of claim 2, wherein said alloy comprises solder placed on top of at least some of the areas in the corresponding pairs and wherein said pins, stubs or loops are made of a material which adheres to solder.

4. The package of claim 3, wherein said material is non-oxidizing.

5. The package of claim 4, wherein said material is gold, silver, aluminum or copper.

6. The package of claim 5, wherein said material is gold and said solder is a lead/tin alloy of about 90% lead and 10% tin.

7. The package of claim 5, wherein said material is aluminum or copper and said solder is a tin/lead alloy of about 60% tin and 40% lead.

8. The package of claim 1, wherein said substrate is a circuit board of a chip-on-board or hybrid construction.

9. The package of claim 8, wherein said circuit board is made of ceramic, fiberglass, porcelain steel or aluminum.

10. The package of claim 1 further comprising a plurality of elongated conducting means on or in the structure for connecting the bonding areas in the second set to desired locations on or in the structure, wherein the spacing between individual conducting means is in the range of about two mils to three mils.

11. The package of claim 1 further comprising bonding means for securely attaching the semiconductor die to the substrate.

12. The package of claim 11, wherein said bonding means is epoxy.

13. The package of claim 1, said alloy including alignment means for facilitating the alignment of the corresponding first set of bonding pads.

14. The package of claim 13, said alignment means comprising a depression in said alloy in at least one of the second set of areas.

15. The package of claim 1, wherein the low temperature alloy is drawn towards a location on the substrate at or near one end of each elongated member.

16. The package of claim 1, wherein the spacing between adjacent bonding pads of the first set of bonding pads and the spacing between adjacent bonding pads in the second set do not exceed about two mils to three mils.

17. The package of claim 10, at least one of said plurality of elongated conducting means comprising alignment means for facilitating the alignment of the corresponding first set of bonding pads.

18. The package of claim 17, said alignment means comprising a depression in at least one of the plurality of elongated conducting means.

19. The package of claim 13, said alloy having a flattened top surface.

\* \* \* \* \*